(12) United States Patent
Lu et al.

(10) Patent No.: US 11,961,580 B2
(45) Date of Patent: Apr. 16, 2024

(54) SENSE AMPLIFIER AND METHOD THEREOF

(71) Applicant: Taiwan Semiconductor Manufacturing Company, Ltd., Hsinchu (TW)

(72) Inventors: Tsung-Che Lu, Tainan (TW); Chin-Ming Fu, Zhubei (TW); Chih-Hsien Chang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

(21) Appl. No.: 17/805,026

(22) Filed: Jun. 1, 2022

(65) Prior Publication Data

US 2023/0395100 A1  Dec. 7, 2023

(51) Int. Cl.
*G11C 7/06* (2006.01)
*G11C 5/14* (2006.01)
(Continued)

(52) U.S. Cl.
CPC ............... *G11C 7/062* (2013.01); *G11C 5/14* (2013.01); *G11C 7/1066* (2013.01); *G11C 7/1093* (2013.01); *G11C 7/14* (2013.01)

(58) Field of Classification Search
None
See application file for complete search history.

(56) References Cited

U.S. PATENT DOCUMENTS

| 4,616,148 A | * | 10/1986 | Ochii | .............. | H03K 3/356104 365/208 |
| 4,751,681 A | * | 6/1988 | Hashimoto | ............ | G11C 7/062 365/207 |

(Continued)

FOREIGN PATENT DOCUMENTS

CN  109119119 B  6/2020

OTHER PUBLICATIONS

Behzad Razavi, "The StrongARM Latch [A Circuit for All Seasons]," IEEE Solid-State Circuits Magazine, vol. 7, No. 2, Spring 2015, pp. 12-17.

(Continued)

*Primary Examiner* — Tan T. Nguyen
(74) *Attorney, Agent, or Firm* — Finnegan, Henderson, Farabow, Garrett & Dunner, L.L.P.

(57) ABSTRACT

A sense amplifier includes a first pair of transistors having gate terminals respectively coupled to a first input terminal for receiving a first input signal and to a second input terminal for receiving a second input signal, source terminals coupled to a first power supply terminal, and drain terminals. The sense amplifier also includes a second pair of transistors having gate terminals coupled to a clock terminal, source terminals respectively coupled to the drain terminals of the first pair of transistors, and drain terminals. The sense amplifier also includes a third pair of transistors having gate terminals coupled to the clock terminal, drain terminals respectively coupled to the drain terminals of the second pair of transistors, and source terminals coupled to a second power supply terminal. In addition, the sense amplifier includes an output circuit coupled to the drain terminals of the second pair of transistors and having an output terminal.

20 Claims, 10 Drawing Sheets

(51) Int. Cl.
  *G11C 7/10* (2006.01)
  *G11C 7/14* (2006.01)

(56) References Cited

U.S. PATENT DOCUMENTS

| | | | |
|---|---|---|---|
| 5,504,443 A * | 4/1996 | Gross | G11C 7/062 |
| | | | 327/54 |
| 6,972,601 B2 | 12/2005 | Kim | |
| 7,447,091 B2 * | 11/2008 | Sekiguchi | G11C 7/12 |
| | | | 365/207 |
| 7,522,462 B2 * | 4/2009 | Edahiro | G11C 7/065 |
| | | | 365/208 |
| 9,418,730 B2 | 8/2016 | Gotterba et al. | |
| 10,326,417 B1 | 6/2019 | Rasmus et al. | |
| 2011/0090745 A1 * | 4/2011 | La Rosa | G11C 16/28 |
| | | | 327/51 |
| 2014/0028395 A1 | 1/2014 | Chan et al. | |

OTHER PUBLICATIONS

Michiel van Elzakker et al., "A 10-bit Charge-Redistribution ADC Consuming 1.9 μW at 1 MS/s," IEEE Journal of Solid-State Circuits, vol. 45, No. 5, May 2010, pp. 1007-1015.

* cited by examiner

SENSE AMPLIFIER AND METHOD THEREOF

BACKGROUND

The present disclosure relates to a sense amplifier and method of operating the sense amplifier.

When signals are transmitted between circuits or input to the circuits, some of the signals need to be sensed and amplified to ensure that voltage levels of those signals are correct for the circuits to operate correctly. A sense amplifier senses those signals and outputs signals of suitable voltage levels. Various integrated circuits include one or more sense amplifiers to obtain signals of suitable voltage levels for different operations in various applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
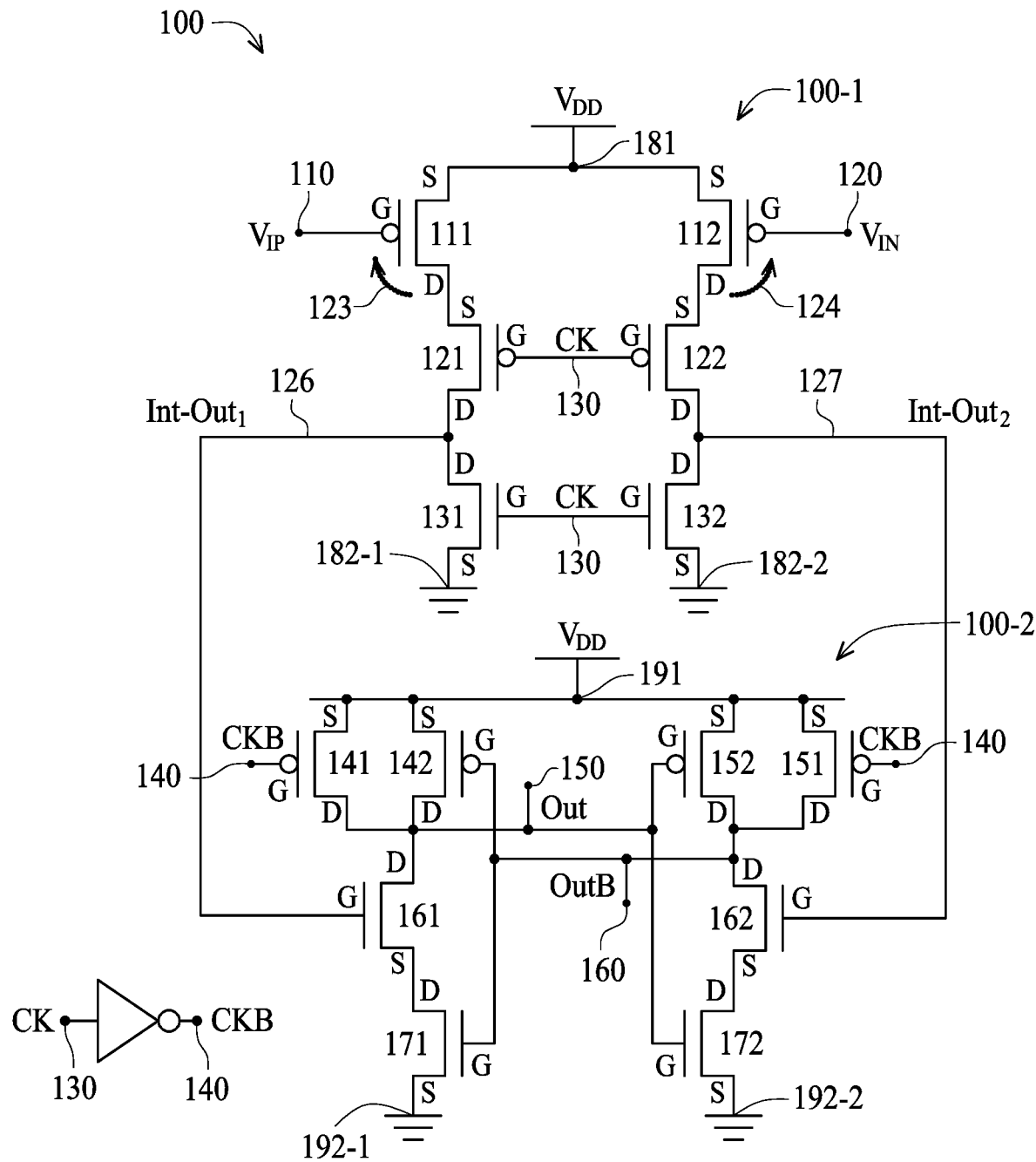
FIG. 1 is a circuit diagram of an exemplary sense amplifier, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

When a circuit receives a signal from another circuit or from a device, the circuit needs to correctly recognize a voltage level of the received signal so that the signal can be interpreted properly for operation. In some embodiments, the received signal may have a small voltage. The circuit may be configured to sense small voltage difference between the received small voltage and a reference voltage, and to amplify the small voltage difference to provide an operable voltage. An operable voltage as used herein is a voltage level high enough to be recognized as a logic "1" or a voltage level low enough to be recognized as a logic "0." The circuit therefore includes one or more sense amplifiers to sense and amplify the received signal.

The circuit may be, for example, an application-specific integrated circuit (ASIC) coupled to a data bus to receive signals. The ASIC includes one or more sense amplifiers to sense the received signals from the data bus and amplify the signals to operable voltage levels for operation in the ASIC. As another example, the circuit may be a general-purpose processor, a digital signal processor, an artificial intelligence (AI) processor, or a graphics processor coupled to a data bus. The processor includes one or more sense amplifiers to sense received signals from the data bus and amplify the signals to operable voltage levels for the processor to proceed with.

As yet another example, the circuit may be a detection circuit coupled to a sensor, such as an image sensor, a touch sensor, a temperature sensor, a sound sensor, or a light sensor. The detection circuit includes one or more sense amplifiers to receive sensed signals from the sensor and amplify the signals to operable voltage levels for detection. As still another example, the circuit may be a memory integrated circuit. The memory integrated circuit includes one or more sense amplifiers to sense data signals from memory cells and amplify the data signals to operable voltage levels before outputting them to a data bus, to a processor, or to an ASIC.

FIG. 1 is a circuit diagram of an exemplary sense amplifier 100, in accordance with some embodiments. As shown in FIG. 1, sense amplifier 100 includes an input circuit 100-1 and an output circuit 100-2. Input circuit 100-1 includes a first pair of transistors 111 and 112, a second pair of transistors 121 and 122, and a third pair of transistors 131 and 132. Output circuit 100-2 includes a fourth pair of transistors 141 and 142, a fifth pair of transistors 151 and 152, a first stacked circuit of two transistors 161 and 171, and a second stacked circuit of two transistors 162 and 172. Output circuit 100-2 is coupled to input circuit 100-1.

The first pair of transistors 111 and 112 are p-channel transistors. Transistor 111 has a gate terminal coupled to a first input terminal 110 for receiving a first input signal $V_{IP}$. Transistor 111 also has a source terminal coupled to a power supply terminal 181. Power supply terminal 181 is coupled to a first power rail providing a positive voltage $V_{DD}$. In addition, transistor 111 has a drain terminal coupled to transistor 121. Transistor 112 has a gate terminal coupled to a second input terminal 120 for receiving a second input signal $V_{IN}$. Transistor 112 also has a source terminal coupled to power supply terminal 181. In addition, transistor 112 has a drain terminal coupled to transistor 122.

The second pair of transistors 121 and 122 are p-channel transistors. Transistor 121 has a gate terminal coupled to a clock terminal 130 for receiving a clock signal CK. Transistor 121 also has a source terminal coupled to the drain terminal of transistor 111. In addition, transistor 121 has a drain terminal coupled to transistor 131. Transistor 122 has a gate terminal coupled to clock terminal 130 for receiving clock signal CK. Transistor 122 also has a source terminal coupled to the drain terminal of transistor 112. In addition, transistor 122 also has a drain terminal coupled to transistor 132.

The third pair of transistors 131 and 132 are n-channel transistors. Transistor 131 has a gate terminal coupled to clock terminal 130 for receiving clock signal CK. Transistor 131 also has a drain terminal coupled to the drain terminal of transistor 121. In addition, transistor 131 has a source terminal coupled to a power supply terminal 182-1. Power supply terminal 182-1 is coupled to a second power rail providing a reference voltage level, e.g., a ground level GND. Transistor 132 has a gate terminal coupled to clock terminal 130 for receiving clock signal CK. Transistor 132 also has a drain terminal coupled to the drain terminal of transistor 122. In addition, transistor 132 has a source terminal coupled to a power supply terminal 182-2. Power supply terminal 182-2 is also coupled to the second power rail providing the ground level GND.

As shown in FIG. 1, output circuit 100-2 is coupled to the drain terminals of the second pair of transistors 121 and 122 through conductive lines 126 and 127. Output circuit 100-2 has a first output terminal 150 and a second output terminal 160. Output terminal 150 is configured to output an output signal Out. Output terminal 160 is configured to output an output signal OutB. Output signal OutB is an inverted signal of output signal Out.

The fourth pair of transistors 141 and 142 are p-channel transistors. Transistor 141 has a source terminal coupled to a power supply terminal 191. Power supply terminal 191 is coupled to the first power rail providing the positive voltage $V_{DD}$. Transistor 141 also has a drain terminal coupled to output terminal 150. In addition, transistor 141 has a gate terminal coupled to a clock terminal 140 for receiving a clock signal CKB. Clock signal CKB is an inverted clock signal CK. Transistor 142 has a source terminal coupled to power supply terminal 191 providing the positive voltage $V_{DD}$. Transistor 142 also has a drain terminal coupled to output terminal 150. In addition, transistor 142 has a gate terminal coupled to output terminal 160.

The fifth pair of transistors 151 and 152 are p-channel transistors. Transistor 151 has a source terminal coupled to power supply terminal 191 providing the positive voltage $V_{DD}$. Transistor 151 also has a drain terminal coupled to output terminal 160. In addition, transistor 151 has a gate terminal coupled to clock terminal 140 for receiving clock signal CKB. Transistor 152 has a source terminal coupled to power supply terminal 191 providing the positive voltage $V_{DD}$. Transistor 152 also has a drain terminal coupled to output terminal 160. In addition, transistor 152 has a gate terminal coupled to output terminal 150.

The first stacked circuit of two transistors 161 and 171 is coupled between the drain terminals of the fourth pair of transistors 141 and 142 and a power supply terminal 192-1. Power supply terminal 192-1 is coupled to the second power rail providing the ground level GND. Transistors 161 and 171 are n-channel transistors. Transistor 161 has a gate terminal coupled to the drain terminal of transistor 121 through conductive line 126. Transistor 171 has a gate terminal coupled to output terminal 160.

The second stacked circuit of two transistors 162 and 172 is coupled between the drain terminals of the fifth pair of transistors 151 and 152 and a power supply terminal 192-2. Power supply terminal 192-2 is coupled to the second power rail providing the ground level GND. Transistors 162 and 172 are n-channel transistors. Transistor 162 has a gate terminal coupled to the drain terminal of transistor 122 through conductive line 127. Transistor 172 has a gate terminal coupled to output terminal 150.

As shown and described above with reference to FIG. 1, the first, second, fourth, and fifth pairs of transistors 111, 112, 121, 122, 141, 142, 151, and 152 are p-channel transistors. The third pair of transistors 131 and 132, the first stacked circuit of two transistors 161 and 171, and the second stacked circuit of two transistors 162 and 172 are n-channel transistors. Sense amplifier 100 is considered a p-type sense amplifier because the first pair of transistors 111 and 112 for receiving input signals $V_{IP}$ and $V_{IN}$ are p-channel transistors.

Clock terminal 130 is configured to receive clock signal CK. Clock terminal 140 is configured to receive clock signal CKB. Clock signal CKB has a phase shift from clock signal CK. For example, clock signal CKB may be an inverted signal of clock signal CK and therefore has a phase shift of π (i.e., 180°) from clock signal CK. In some embodiments, sense amplifier 100 also includes an inverter to invert clock signal CK at clock terminal 130 to generate clock signal CKB for clock terminal 140. Alternatively, in some embodiments, sense amplifier 100 may receive clock signal CKB. Sense amplifier 100 may include an inverter to invert clock signal CKB to generate clock signal CK.

As shown and described above with reference to FIG. 1, power supply terminals 181 and 191 are coupled to the first power rail for receiving the positive voltage $V_{DD}$. Power supply terminals 182-1, 182-2, 192-1, and 192-2 are coupled to the second power rail for receiving the ground level GND, which is the reference voltage level for sense amplifier 100. In sense amplifier 100, the positive voltage $V_{DD}$ and the ground level GND are considered high and low voltage levels, such as logic "1" and "0," respectively.

In some embodiments, power supply terminals 182-1, 182-2, 192-1, 192-2 are coupled to an alternative second power rail providing a negative voltage $V_{SS}$. In these embodiments, the positive voltage $V_{DD}$ and the negative voltage $V_{SS}$ are considered high and low voltage levels, such as logic "1" and "0," respectively.

In some embodiments, power supply terminals 181 and 191 are coupled to the first power rail for receiving a first voltage. Power supply terminals 182-1, 182-2, 192-1, and 192-2 are coupled to the second power rail for receiving a second voltage level. In these embodiments, the first and second voltages are considered voltage levels for logic "1" and "0," respectively.

In sense amplifier 100, input terminal 110 is configured to receive input signal $V_{IP}$. Input signal $V_{IP}$ may be a signal of a small voltage from, for example, a data bus, a memory cell, a sensor, or another circuit. Input terminal 120 is configured to receive input signal $V_{IN}$. Input signal $V_{IN}$ may be a signal of a reference voltage from a voltage source. Input circuit 100-1 is configured to evaluate input signal $V_{IP}$ based on input signal $V_{IN}$ and transmit internal output signals Int-Out$_1$ and Int-Out$_2$ to output circuit 100-2 through conductive lines 126 and 127, respectively. Output circuit 100-2 is configured to provide output signals Out and OutB based on internal output signals Int-Out$_1$ and Int-Out$_2$.

When the small voltage of input signal $V_{IP}$ is greater than the reference voltage of input signal $V_{IN}$, sense amplifier 100 is configured to provide output signal Out as the positive voltage $V_{DD}$ and output signal OutB as the ground level GND. When the small voltage of input signal $V_{IP}$ is less than the reference voltage of input signal $V_{IN}$, sense amplifier 100 is configured to provide output signal Out as the ground level GND and output signal OutB as the positive voltage $V_{DD}$. Accordingly, sense amplifier 100 is configured to sense input signal $V_{IP}$ based on input signal $V_{IN}$ and amplify the small voltage of input signal $V_{IP}$ to either the positive voltage $V_{DD}$ or the ground level GND, both of which are operable voltage levels for operation in other circuits.

As shown in FIG. 1, in input circuit 100-1, transistors 111, 121, and 131 are coupled in series as a third stacked circuit of three transistors between power supply terminals 181 and 182-1. Transistors 112, 122, and 132 are also coupled in series as a fourth stacked circuit of three transistors between power supply terminals 181 and 182-2. That is, input circuit 100-1 of sense amplifier 100 includes two stacked circuits of three transistors coupled between power supply terminal 181 and power supply terminals 182-1 and 182-2.

In output circuit 100-2, transistors 141, 161, and 171 are coupled as a fifth stacked circuit of three transistors between power supply terminals 191 and 192-1. Transistors 142, 161, and 171 are also coupled as a sixth stacked circuit of three transistors between power supply terminals 191 and 192-1. Transistors 151, 162, and 172 are coupled as a seventh stacked circuit of three transistors between power supply terminals 191 and 192-2. Transistors 152, 162, and 172 are also coupled as an eighth stacked circuit of three transistors between power supply terminals 191 and 192-2. That is, output circuit 100-2 of sense amplifier 100 includes four stacked circuits of three transistors coupled between power supply terminal 191 and power supply terminals 192-1 and 192-2.

From another aspect, as shown in FIG. 1, sense amplifier 100 includes the third stacked circuit of transistors 111, 121, and 131 coupled between power supply terminals 181 and 182-1. Transistor 111 includes the source terminal coupled to power supply terminal 181 and the gate terminal coupled to input terminal 110 for receiving input signal $V_{IP}$. Transistor 121 is coupled between transistors 111 and 131. Transistor 131 is coupled between transistor 121 and power supply terminal 182-1.

Sense amplifier 100 also includes the fourth stacked circuit of transistors 112, 122, and 132 coupled between power supply terminals 181 and 182-2. Transistor 112 includes the source terminal coupled to power terminal 181 and the gate terminal coupled to input terminal 120 for receiving input signal $V_{IN}$. Transistor 122 is coupled between transistors 112 and 132. Transistor 132 is coupled between transistor 122 and power supply terminal 182-2.

Sense amplifier 100 also includes output circuit 100-2 coupled to the third and fourth stacked circuits. Output circuit 100-2 has output terminal 150, and includes fifth, sixth, seventh, and eighth stacked circuits each having three transistors. The fifth stacked circuit includes transistors 141, 161, and 171 coupled between power supply terminals 191 and 192-1. The sixth stacked circuit includes transistors 142, 161, and 171 coupled between power supply terminals 191 and 192-2. That is, the fifth and sixth stacked circuits share the first stacked circuit of two transistors 161 and 171. The seventh stacked circuit includes transistors 151, 162, and 172 coupled between power supply terminals 191 and 192-2. The eighth stacked circuit includes transistors 152, 162, and 172 coupled between power supply terminals 191 and 192-2. That is, the seventh and eighth stacked circuits share the second stacked circuit of two transistors 162 and 172.

As shown in FIG. 1, output circuit 100-2 is coupled to the drain terminals of transistors 121 and 122 through conductive lines 126 and 127. The gate terminals of transistors 121, 122, 131, and 132 are coupled to clock terminal 130. Transistors 111, 112, 121, 122 are p-type transistors. Transistors 131, 132 are n-type transistors. The n-type transistors are a different type than the p-type transistors. The n-type transistors are, for example, n-channel metal oxide semiconductor field effect transistors (MOSFETs) or other n-channel transistors. The p-type transistors are, for example, p-channel MOSFETs or other p-channel transistors.

Stacking three transistors allows sense amplifier 100 to operate at a higher speed than those sense amplifiers stacking four or more transistors. For example, if sense amplifier 100 operates with a positive voltage of 450 millivolts (mV), i.e., $V_{DD}$=450 mV, output signal Out may have a stable voltage (e.g., $V_{DD}$ or GND) after 75 picoseconds (ps) from a time instant at which clock signal CK transits from the high voltage level to the low voltage level. Another sense amplifier stacking four transistors may take 110 to 200 ps to provide a stable output signal. Accordingly, stacking three transistors helps sense amplifier 100 to operate at a higher speed than sense amplifiers stacking four or more transistors.

In addition, the stacking of only three transistors allows sense amplifier 100 to be supplied with the voltage $V_{DD}$ having a lower voltage level than that supplied to sense amplifiers stacking four or more transistors. For example, sense amplifier 100 may be capable of operating at a clock rate while supplied with a minimum positive voltage of 450 mV, i.e., $V_{DD\_min}$=450 mV. Another sense amplifier stacking four transistors may require a minimum positive voltage of 600 mV to operate at the same clock rate. Accordingly, stacking three transistors allows sense amplifier 100 to operate in a lower minimum positive voltage $V_{DD}$ than sense amplifiers stacking four or more transistors.

As described above, the first pair of transistors 111 and 112 are configured to receive input signals $V_{IP}$ and $V_{IN}$. The source terminals of the first pair of transistors 111 and 112 are coupled to power supply terminal 181 for supply of the positive voltage $V_{DD}$, which is a fixed voltage level. That is, power supply terminal 181 is configured to provide power of the fixed voltage level $V_{DD}$ to the source terminals of the first pair of transistors 111 and 112.

In some embodiments, parasitic capacitors $C_{GS-111}$ and $C_{GD-111}$ (not shown in FIG. 1) may exist between the gate and source terminals and between the gate and drain terminals of transistor 111. Parasitic capacitors $C_{GS-112}$ and $C_{GD-112}$ (not shown in FIG. 1) may exist between the gate and source terminals and between the gate and drain terminals of transistor 112. In sense amplifier 100, coupling the source terminals of transistors 111 and 112 to power supply terminal 181 is helpful to avoid or reduce kickback noise through parasitic capacitors $C_{GS-111}$ and $C_{GS-112}$ because power supply terminal 181 is configured to be supplied with the fixed voltage $V_{DD}$. That is, when sense amplifier 100 operates, one end of each of the parasitic capacitors $C_{GS-111}$ and $C_{GS-112}$ is supplied with the fixed voltage $V_{DD}$, whose frequency is considered as zero or a very low frequency. Thus, a capacitive reactance (i.e., impedance) value of each of the parasitic capacitors $C_{GS-111}$ and $C_{GS-112}$ may be an infinitive value or a significantly large value. As a result, no or a very low unwanted current (i.e., kickback noise) flows between the source and gate terminals of each of transistors 111 and 112 through the parasitic capacitors $C_{GS-111}$ and $C_{GS-112}$. Accordingly, input signals $V_{IP}$ and $V_{IN}$ are not affected by the possible kickback noise from the source terminals of transistors 111 and 112.

In another aspect, when sense amplifier 100 operates, voltage values at the drain terminals of transistors 111 and 112 may vary (i.e., rise and/or fall) sharply between the ground level GND and the positive voltage level $V_{DD}$.

Because of the sharp variation, the voltage values at the drain terminals of transistors 111 and 112 are considered as voltage signals with a high frequency at one end of each of the parasitic capacitors $C_{GD\text{-}111}$ and $C_{GD\text{-}112}$. Thus, a capacitive reactance (i.e., impedance) value of each of the parasitic capacitors $C_{GD\text{-}111}$ and $C_{GD\text{-}112}$ is a small value. As a result, unwanted currents (i.e., kickback noise) may flow between the drain and gate terminals of each of transistors 111 and 112 through paths 123 and 124 (FIG. 1) (i.e., via parasitic capacitors $C_{GD\text{-}111}$ and $C_{GD\text{-}112}$). The kickback noise may cause voltage disturbance on input signals $V_{IP}$ and/or $V_{IN}$ during the operation of sense amplifier 100. Nonetheless, as explained above, the possible kickback noise from the source terminals of transistors 111 and 112 is avoided or reduced. The total kickback noise in sense amplifier 100 is reduced. As a result, this is helpful for accuracy of output signal Out. It may also benefit implementation of sense amplifier 100 in sensing circuits as described below with reference to FIGS. 4A, 5A, 6, and 7.

As shown and described above with reference to FIG. 1, in input circuit 100-1, the first pair of transistors 111 and 112 and the second pair of transistors 121 and 122 are p-channel transistors. The third pair of transistors 131 and 132 are n-channel transistors. Power supply terminal 181 is configured to provide power of the positive voltage level $V_{DD}$. Power supply terminals 182-1 and 182-2 are configured to provide power of a reference voltage level, i.e., the ground level GND.

From another aspect, as described above and shown in FIG. 1, in sense amplifier 100, the first pair of transistors 111 and 112, the second pair of transistors 121 and 122, the fourth pair of transistors 141 and 142, and the fifth pair of transistors 151 and 152 are p-channel transistors. The third pair of transistors 131 and 132, the first stacked circuit of two transistors 161 and 171, and the second stacked circuit of two transistors 162 and 172 are n-channel transistors.

Sense amplifier 100 (FIG. 1) is configured to sense input signal $V_{IP}$ based on input signal $V_{IN}$, amplify input signal $V_{IP}$ based on the sensing result, and generate output signal Out at an operable voltage, e.g., 0 or $V_{DD}$ volts. The voltage of input signal $V_{IN}$ is the reference voltage for sense amplifier 100 to determine that output signal Out should be 0 or $V_{DD}$ volts. More specifically, sense amplifier 100 is configured to compare the voltages of input signals $V_{IP}$ and $V_{IN}$ and generate output signal Out with $V_{DD}$ volts if the voltage of input signal $V_{IP}$ is greater than the voltage of input signal $V_{IN}$, or with 0 volts (GND) if the voltage of input signal $V_{IP}$ is less than the voltage of input signal $V_{IN}$. More operational details of sense amplifier 100 are described below with joint reference to FIGS. 1 and 2A-2C.

Figure 2A:
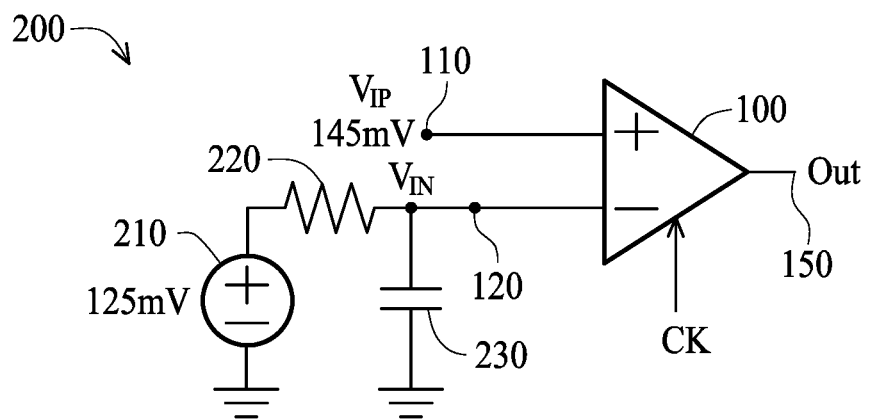
FIG. 2A is a circuit diagram of an exemplary sensing circuit that includes the exemplary sense amplifier in FIG. 1, in accordance with some embodiments.

FIG. 2A is a diagram of an exemplary sensing circuit 200, in accordance with some embodiments. As shown in FIG. 2A, sensing circuit 200 includes sense amplifier 100 (FIG. 1), a voltage source 210, a resistor 220, and a capacitor 230. Voltage source 210, resistor 220, and capacitor 230 are coupled in series as a reference voltage supply circuit to provide a reference voltage of 125 millivolts (mV). Terminal 120 of sense amplifier 100 is coupled to the reference voltage supply circuit to receive input signal $V_{IN}$ of 125 mV, i.e., $V_{IN}$=125 mV. Terminal 110 of sense amplifier 100 is configured to receive an exemplary voltage signal of 145 mV, i.e., $V_{IP}$=145 mV, from, for example, a data bus (not shown).

Figure 2B:
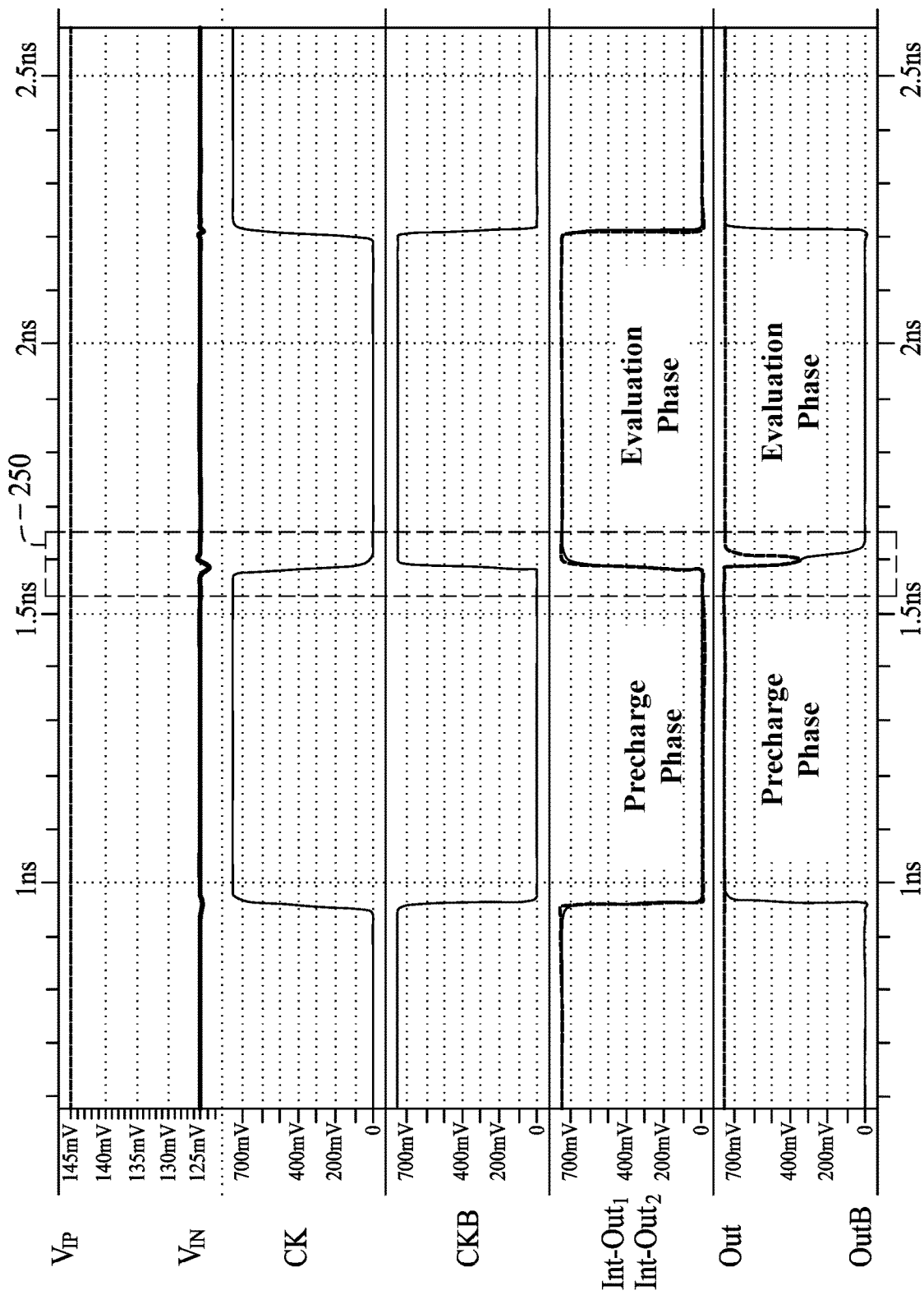
FIG. 2B illustrates exemplary voltage changes of signals in the sense amplifier in FIG. 1, in accordance with some embodiments.

FIG. 2B illustrates exemplary voltage changes of signals in sense amplifier 100 in FIG. 1, in accordance with some embodiments. As shown in FIG. 2B, voltage levels of input signals $V_{IP}$ and $V_{IN}$, clock signals CK and CKB, internal output signals Int-Out$_1$ and Int-Out$_2$, and output signals Out and OutB of sense amplifier 100 (FIG. 1) implemented in sensing circuit 200 (FIG. 2A) are illustrated. The voltage levels are simulated results using a positive voltage of 750 mV at the first power rail, i.e., $V_{DD}$=750 mV.

In FIG. 2A, input terminal 110 of sense amplifier 100 is configured to receive input signal $V_{IP}$ of 145 mV, and input terminal 120 of sense amplifier 100 is configured to receive input signal $V_{IN}$ of 125 mV. As shown in FIG. 2B, input signals $V_{IP}$ and $V_{IN}$ have voltage levels of 145 mV and 125 mV, respectively. Clock signal CKB is an inverted signal of clock signal CK.

The operation of sense amplifier 100 includes a precharge phase and an evaluation phase (FIG. 2B). In the precharge phase, clock signal CK is at a high voltage level of 750 mV, i.e., $V_{DD}$ volts. In input circuit 100-1, when clock signal CK is at the high voltage level, the second pair of transistors 121 and 122 are switched off, thereby isolating the first pair of transistors 111 and 112 from the third pair of transistors 131 and 132 and from output circuit 100-2. Meanwhile, because clock signal CK is at the high voltage level, the third pair of transistors 131 and 132 are switched on. Voltages of the drain terminals of transistors 131 and 132 as well as transistors 121 and 122 are therefore all pulled down to the ground level GND. Thus, internal output signals Int-Out$_1$ and Int-Out$_2$ on conductive lines 126 and 127 are both at the ground level GND, i.e., 0 volts, as shown in FIG. 2B.

In output circuit 100-2, when internal output signals Int-Out$_1$ and Int-Out$_2$, provided to the gate terminals of transistors 161 and 162, are both at the ground level GND, transistors 161 and 162 are switched off. In the precharge phase, clock signal CKB is at a low voltage level, i.e., 0 volts. Transistor 141, receiving clock signal CKB at the gate terminal, is therefore switched on. Output signal Out is then charged to 750 mV, i.e., $V_{DD}$ volts. Meanwhile, when clock signal CKB is at the low voltage level, transistor 151 is also switched on. Output signal OutB is also charged up to 750 mV, i.e., $V_{DD}$ volts. Thus, in the precharge phase, both output signals Out and OutB are charged up to the high voltage level of 750 mV ($V_{DD}$), as shown in FIG. 2B.

When clock signal CK transits from the high voltage level to the low voltage level (i.e., from 750 mV to 0 volts), sense amplifier 100 enters the evaluation phase. In the evaluation phase, clock signal CK is at the low voltage level (0 volts). In input circuit 100-1, when clock signal CK is at the low voltage level, the second pair of transistors 121 and 122 are switched on, and the third pair of transistors 131 and 132 are switched off. Because the voltages of input signals $V_{IP}$ (145 mV) and $V_{IN}$ (125 mV) are low voltages as compared to 750 mV ($V_{DD}$), the first pair of transistors 111 and 112 allows certain currents to flow from power supply terminal 181 through the switched-on transistors 121 and 122. Thus, the voltages of the drain terminals of transistors 121 and 122 are pulled up to the high voltage level of 750 mV. Internal output signals Int-Out$_1$ and Int-Out$_2$ on conductive lines 126 and 127 are also pulled up to the high voltage level of 750 mV, as shown in FIG. 2B.

Input signals $V_{IP}$ (145 mV) and $V_{IN}$ (125 mV) have different voltages; therefore, the currents allowed to flow through transistors 111 and 112 are different. Thus, internal output signals Int-Out$_1$ and Int-Out$_2$ have a phase difference. In this embodiment, because the voltage of input signal $V_{IN}$ (125 mV) is lower than the voltage of input signal $V_{IP}$ (145 mV), the current allowed to flow through transistor 112 is greater than the current allowed to flow through transistor 111. Internal output signal Int-Out$_2$ is therefore pulled up faster than internal output signal Int-Out$_1$. That is, output signal Int-Out$_2$ has a more advanced phase than internal output signal Int-Out$_1$.

When the voltage of internal output signal Int-Out$_2$ is pulled up faster than the voltage of internal output signal Int-Out$_1$, transistor 162 is switched on faster, i.e., earlier, than transistor 161. In the beginning of transition from the precharge phase to the evaluation phase, transistors 171 and 172 (n-channel transistor) temporarily remain switched-on because both output signals Out and OutB are at the high voltage level in the precharge phase. When both transistors 162 and 172 are switched on, output signal OutB is pulled down to the low voltage level (0 volts). A short time later, transistor 161, together with transistor 171, is also switched on, so that output signal OutB also starts to be pulled down in the beginning of the transition to the evaluation phase.

When the voltage of output signal OutB starts to fall, transistor 142 starts to be switched on. This allows the high voltage $V_{DD}$ at power supply voltage 191 to pull up the voltage of output signal Out. When the voltage of output signal OutB continues to be pulled down, faster than OutB is, to the low voltage level (0 volts), transistor 171 is switched off. As a result, output signal Out is then pulled up to the high voltage level of 750 mV, as shown in FIG. 2B.

Accordingly, when the voltage of input signal $V_{IP}$ (145 mV) is greater than the voltage of input signal $V_{IN}$ (125 mV), sense amplifier 100 is configured to generate output signals Out and OutB with the high voltage level and the low voltage level, respectively. The high voltage level (750 mV) of output signal Out is considered the sensed and amplified result from input signal $V_{IP}$ (145 mV), which is greater than the reference voltage of input signal $V_{IN}$ (125 mV).

Alternatively, if input terminal 110 (FIG. 1) receives an input signal $V_{IP}$ that is, for example, 5 mV, the voltage of input signal $V_{IP}$ (5 mV) is less than the voltage of input signal $V_{IN}$ (125 mV). As a result, a current allowed to flow through transistor 111 is greater than a current allowed to flow through transistor 112. Internal output signal Int-Out$_1$ is pulled up faster than internal output signal Int-Out$_2$. That is, internal output signal Int-Out$_1$ has a more advanced phase than internal output signal Int-Out$_2$. Transistor 161 is therefore switched on faster, i.e., earlier, than transistor 162. Thus, output signal Out is pulled down to the low voltage level. Output signal OutB is pulled up to the high voltage level when transistor 152 is switched on by the low voltage level of output signal Out.

Figure 2C:
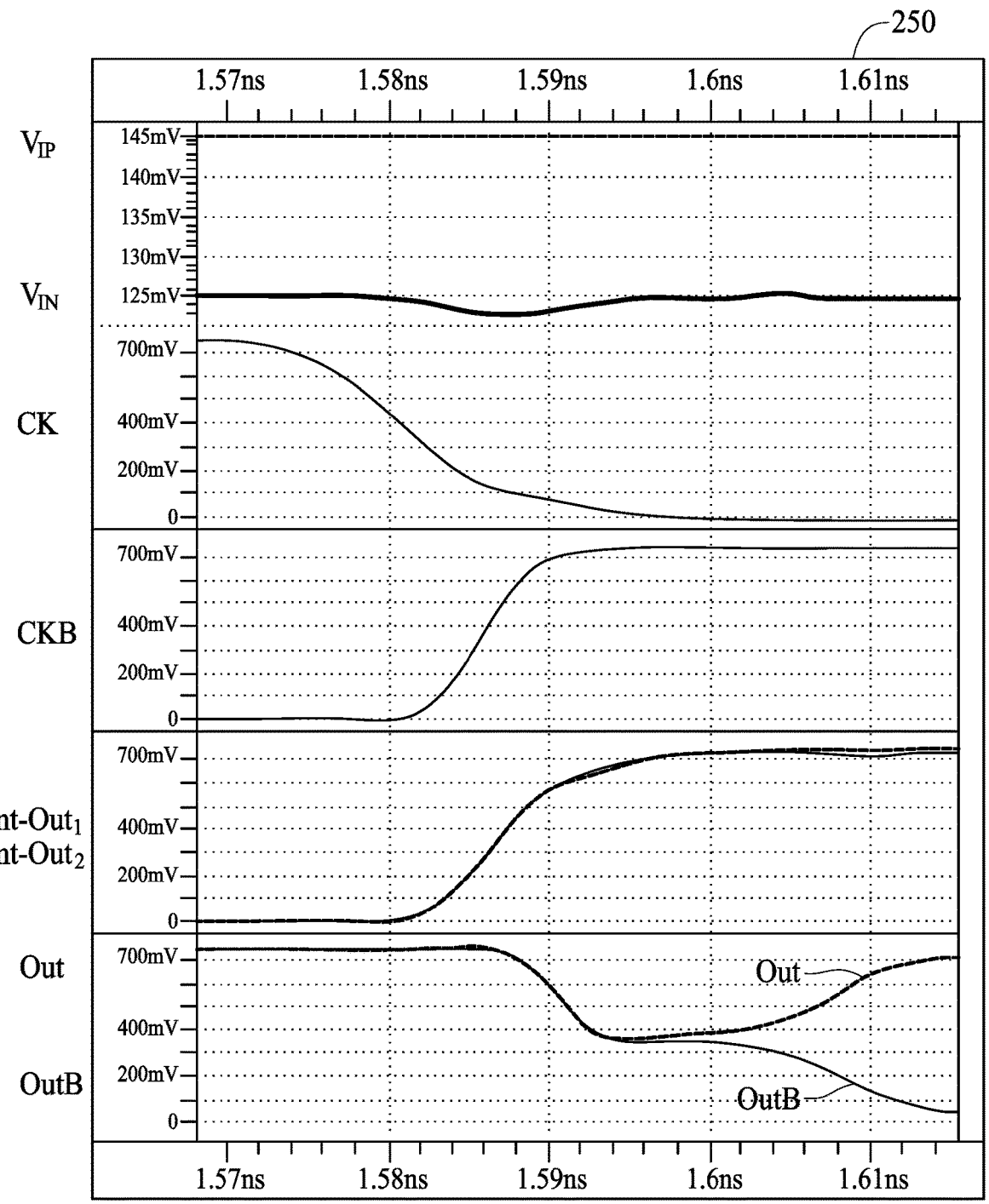
FIG. 2C is a partially enlarged view of the exemplary voltage changes within a period in FIG. 2B, in accordance with some embodiments.

FIG. 2C is a partially enlarged view of the exemplary voltage changes within a period 250 in FIG. 2B, in accordance with some embodiments. Period 250 is a transition period from the precharge phase to the evaluation phase. In the beginning of period 250, both internal output signals Int-Out$_1$ and Int-Out$_2$ are at the low voltage level. When clock signal CK starts to fall from the high voltage level to the low voltage level, i.e., a negative edge of clock signal CK, transistors 121 and 122 are switched on. As described above with reference to FIGS. 1, 2A, and 2B, the positive voltage level ($V_{DD}$) at power supply terminal 181 starts to pull up internal output signals Int-Out$_1$ and Int-Out$_2$. The latter is pulled up faster than the former.

As explained above, unwanted current (i.e., kickback noise) may flow between the drain and gate terminals of each of transistors 111 and 112 through paths 123 and 124 (FIG. 1) when parasitic capacitors $C_{GD\text{-}111}$ and $C_{GD\text{-}112}$ have a small capacitive reactance value. As shown in FIG. 2C, the voltage of input signal $V_{IN}$ is pulled down a small amount first and then up a small amount between 1.57 nanoseconds (ns) and 1.61 ns by the kickback noise. For example, the voltage of input signal $V_{IN}$ may be pulled down by 2.4 mV at 1.586 and 1.588 ns and pulled up by 0.3 mV at 1.604 and 1.606 ns by the kickback noise through path 124.

In sense amplifier 100, the kickback noise may affect input signals $V_{IP}$ and $V_{IN}$ only through paths 123 and 124 (FIG. 1), i.e., parasitic capacitors $C_{GD\text{-}111}$ and $C_{GD\text{-}112}$. No or few kickback noise flows through parasitic capacitors $C_{GS\text{-}111}$ and $C_{GS\text{-}112}$ because the source terminals of transistors 111 and 112 are coupled to the fixed voltage $V_{DD}$. This helps shorten a kickback noise period, a period within which the kickback noise occurs and may impact input signals $V_{IP}$ and $V_{IN}$. For example, in sense amplifier 100, the kickback noise period may be about 40 ps. A kickback noise period may be up to 250 ps for another sense amplifier in which kickback noise can flow through both parasitic capacitors between the gate and source terminals and between the gate and drain terminals.

Reducing kickback noise in sense amplifier 100 also helps reduce voltage variation ranges of input signals $V_{IP}$ and $V_{IN}$. For example, input signal $V_{IN}$ (FIG. 2C) may be pulled down by 2.4 mV and up by 0.3 mV in sense amplifier 100. In another sense amplifier in which kickback noise can flow through both parasitic capacitors between the gate and source terminals and between the gate and drain terminals, an input signal may be pulled up 13-16 mV and down 13-18 mV in a kickback noise period. The reduced, small voltage variation range is helpful to improve the accuracy of sensing results of sense amplifier 100. In addition, because the kickback noise in sense amplifier 100 is small, other circuit design changes or implementations for reducing the kickback noise, e.g., reducing sizes of transistors 111 and 112, may not be needed. The operation speed of sense amplifier 100 can therefore be maintained by not reducing the transistor sizes.

Figure 3:
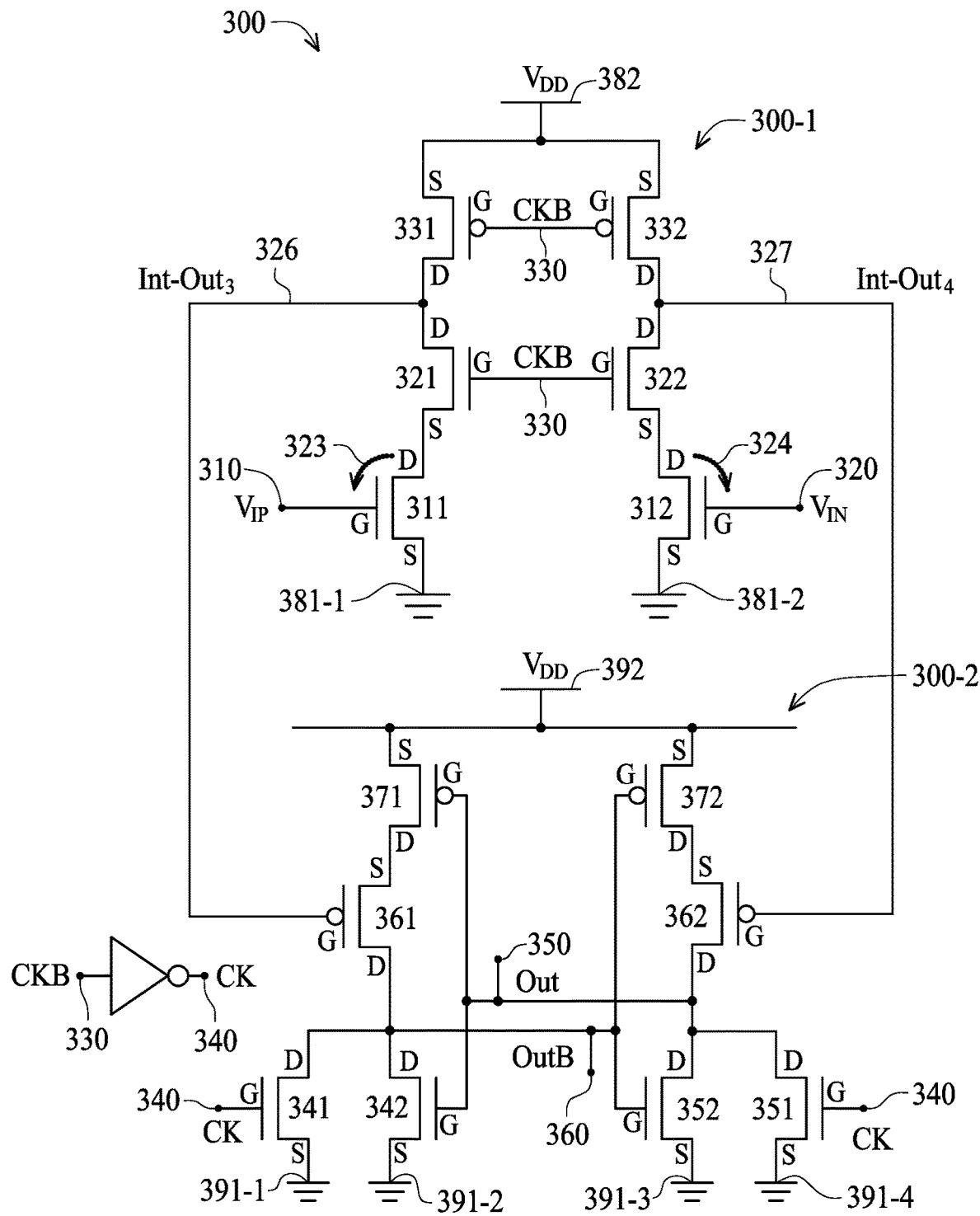
FIG. 3 is a circuit diagram of another exemplary sense amplifier, in accordance with some embodiments.

FIG. 3 is a circuit diagram of another exemplary sense amplifier 300, in accordance with some embodiments. As shown in FIG. 3, sense amplifier 300 includes an input circuit 300-1 and an output circuit 300-2. Input circuit 300-1 includes a first pair of transistors 311 and 312, a second pair of transistors 321 and 322, and a third pair of transistors 331 and 332. Output circuit 300-2 includes a fourth pair of transistors 341 and 342, a fifth pair of transistors 351 and 352, a first stacked circuit of two transistors 361 and 371, and a second stacked circuit of two transistors 362 and 372. Output circuit 300-2 is coupled to input circuit 300-1 through conductive lines 326 and 327 for receiving internal output signals Int-Out$_3$ and Int-Out$_4$, respectively. Paths 323 and 324 may be formed when parasitic capacitors between the gate and drain terminals of each of the first pair of transistors 311 and 312 exist.

In input circuit 300-1, the first pair of transistors 311 and 312 and the second pair of transistors 321 and 322 are n-channel transistors. The third pair of transistors 331 and 332 are p-channel transistors. Power supply terminals 381-1 and 381-2 are coupled the second power rail for the ground level GND, i.e., the reference voltage level. Power supply terminal 382 is coupled to the first power rail for the positive voltage level $V_{DD}$.

In output circuit 300-2, the fourth pair of transistors 341 and 342 and the fifth pair of transistors 351 and 352 are n-channel transistors. The first stacked circuit of two transistors 361 and 371 and the second stacked circuit of two transistors 362 and 372 are p-channel transistors. Power supply terminals 391-1, 391-2, 391-3, and 391-4 are coupled the second power rail for the ground level GND. Power supply terminal 392 is coupled to the first power rail for the positive voltage level $V_{DD}$.

In some embodiments, sense amplifier 300 also includes an inverter to invert received clock signal CKB at clock terminal 330 to provide clock signal CK at clock terminal 340. Alternatively, in some embodiments, sense amplifier 300 may receive clock signal CK. Sense amplifier 300 may include an inverter to invert clock signal CK to generate clock signal CKB.

Sense amplifier 300 is considered an n-type sense amplifier because the first pair of transistors 311 and 312, whose gate terminals are coupled to input terminals 310 and 320 for receiving input signals $V_{IP}$ and $V_{IN}$, are n-channel transistors. Sense amplifier 300 (FIG. 3) operates similarly to the operation of sense amplifier 100 (FIG. 1). The operation of sense amplifier 300 can be understood by referring to the operation of sense amplifier 100 described above with reference to FIGS. 1 and 2A-2C by considering correspondence between n-channel and p-channel transistors.

In sense amplifier 300, the first, second, fourth, and fifth pairs of transistors 311, 312, 321, 322, 341, 342, 351, and 352 are n-channel transistors. The third pair of transistors 331 and 332, the first stacked circuit of two transistors 361 and 371, and the second stacked circuit of two transistors 362 and 372 are p-channel transistors.

In sense amplifier 300, power supply terminals 381-1, 381-2, 391-1, 391-2, 391-3, and 391-4 are coupled to the second power rail for receiving the reference voltage level GND, which is the reference voltage level for sense amplifier 300. Power supply terminals 382 and 392 are coupled to the first power rail for receiving the positive voltage level $V_{DD}$. In sense amplifier 300, the positive voltage $V_{DD}$ and the ground level GND are considered high and low voltage levels respectively corresponding to logic "1" and "0."

In some embodiments, power supply terminals 381-1, 381-2, 391-1, 391-2, 391-3, and 391-4 (FIG. 3) are coupled to the alternative second power rail providing a negative voltage $V_{SS}$. In these embodiments, the positive voltage $V_{DD}$ and the negative voltage $V_{SS}$ are considered high and low voltage levels respectively corresponding to logic "1" and "0."

From another aspect, as shown in FIG. 3, sense amplifier 300 includes a third stacked circuit of transistors 311, 321, and 331 coupled between power supply terminals 381-1 and 382. Sense amplifier 100 also includes a fourth stacked circuit of transistors 312, 322, and 332 coupled between power supply terminals 381-2 and 382. Sense amplifier 300 also includes output circuit 300-2 coupled to the third and fourth stacked circuits. Output circuit 300-2 has output terminal 350, and includes fifth, sixth, seventh, and eighth stacked circuits each having three transistors. That is, sense amplifier 300 includes these stacked circuits of only three transistors, like those in sense amplifier 100 (FIG. 1). In addition, the source terminals of the first pair of transistors 311 and 312 are coupled to the ground level GND, i.e., a fixed voltage level. Kickback noise in sense amplifier 300 is also reduced as explained above for sense amplifier 100. Thus, sense amplifier 300 has all the advantages of sense amplifier 100 described above with reference to FIGS. 1 and 2A-2C.

Figure 4A:
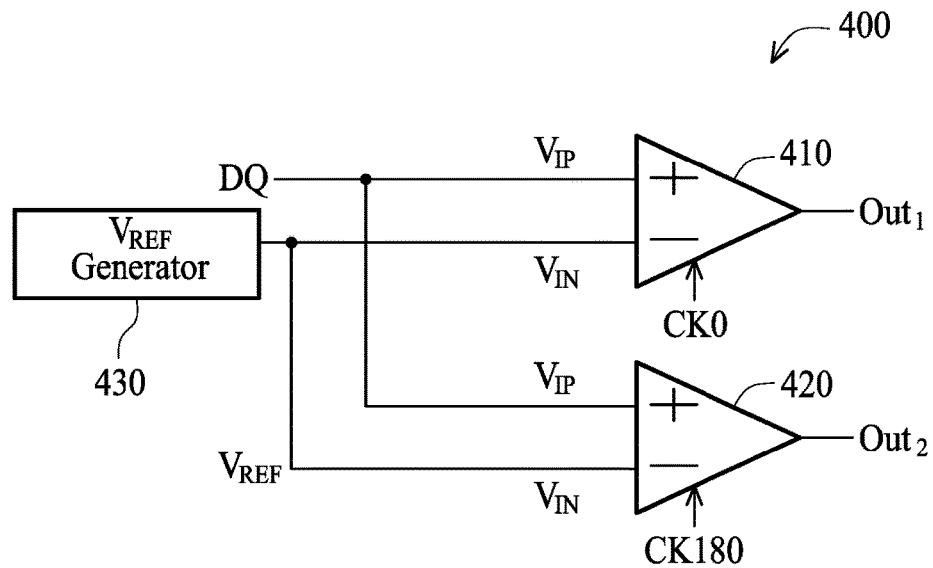
FIG. 4A is a diagram of another exemplary sensing circuit, in accordance with some embodiments.

FIG. 4A is a diagram of another exemplary sensing circuit 400, in accordance with some embodiments. As shown in FIG. 4A, sensing circuit 400 includes sense amplifiers 410 and 420 and a reference voltage ($V_{REF}$) generator 430. Sense amplifiers 410 and 420 are both implemented based on sense amplifier 300 (FIG. 3). Input terminals of sense amplifiers 410 and 420 for receiving input signals $V_{IN}$ are coupled to $V_{REF}$ generator 430. Input terminals of sense amplifiers 410 and 420 for receiving input signals $V_{IP}$ are coupled to a data bus DQ. Sense amplifiers 410 and 420 respectively receive clock signals CK0 and CK180. Clock signal CK180 has a phase shift of 180° (i.e., π) from clock signal CK0. Clock signals CK0 and CK180 each correspond to clock signal CKB (FIG. 3) in sense amplifier 300. Sense amplifiers 410 and 420 respectively generate output signals $Out_1$ and $Out_2$ based on input signals $V_{IP}$ and $V_{IN}$ from data bus DQ and $V_{REF}$ generator 430.

In a conventional sensing circuit, two reference signal generators may be needed to generate two reference voltage signals for two sense amplifiers. In another conventional sensing circuit, two unit-gain buffers may be needed to enhance a reference voltage signal from a reference signal generator and provide two enhanced reference voltage signals to two sense amplifiers. One reason for using two reference signal generators or two unit-gain buffers is to reduce the impact of kickback noise on input signal $V_{IN}$ of the sense amplifiers. The accuracy of sensing results may therefore be maintained. As shown in FIG. 4A, in sensing circuit 400, input signal $V_{IN}$ is generated by the single $V_{REF}$ generator 430 and provided to both sense amplifiers 410 and 420 without using any buffers. This is possible because of the reduced kickback noise in sense amplifier 100 (FIG. 3), as explained for sense amplifier 100 (FIG. 1). Sensing circuit 400 does not need an additional $V_{REF}$ generator or two unit-gain buffers and therefore has reduced area, as compared to conventional sensing circuits.

Figure 4B:
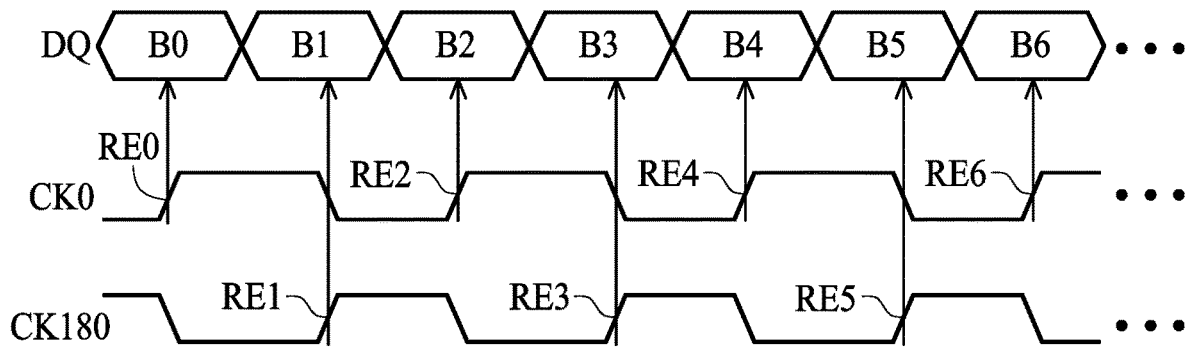
FIG. 4B is an exemplary timing diagram of the sensing circuit in FIG. 4A, in accordance with some embodiments.

FIG. 4B is an exemplary timing diagram of sensing circuit 400 in FIG. 4A, in accordance with some embodiments. As shown in FIG. 4B, data bus DQ has bit signals B0 to B6 in series. Clock signal CK0's rising edges RE0, RE2, RE4, and RE6 occur when bit signals B0, B2, B4, and B6 are stable, respectively. Clock signal CK180's rising edges RE1, RE3, and RE5 occur when bit signals B1, B3, and B5 are stable, respectively.

When clock signal CK0 transits from a low voltage level to a high voltage level at rising edge RE0, sense amplifier 410 is configured to sense bit signal B0 (i.e., $V_{IP}$) based on reference voltage $V_{REF}$ (i.e., $V_{IN}$) provided by $V_{REF}$ generator 430. If a voltage of bit signal B0 ($V_{IP}$) is greater than reference voltage $V_{REF}$ ($V_{IN}$), sense amplifier 410 is configured to generate output signal $Out_1$ with a high voltage level. If the voltage of bit signal B0 ($V_{IP}$) is less than reference voltage $V_{REF}$ ($V_{IN}$), sense amplifier 410 is configured to generate output signal $Out_1$ with a low voltage level. Accordingly, sense amplifier 410 senses and amplifies bit signal B0 and generates output signal $Out_1$ as an operable voltage for other circuits to process. Similarly, sense amplifier 410 is also configured to sense and amplify bit signals B2, B4, and B6 respectively at rising edges RE2, RE4, and RE6, and generate output signal $Out_1$ with operable voltages sequentially.

Sense amplifier 420 is configured to sense and amplify bit signals B1, B3, and B5 respectively at rising edges RE1, RE3, and RE5, and generate output signal $Out_2$ with operable voltages corresponding to the bit signals.

In sensing circuit 400, sense amplifiers 410 and 420 are configured to sense and amplify bit signals B0 to B6 from data bus DQ. This allows sensing circuit 400 to operate at a double data rate (DDR), as compared to a clock rate of clock signal CK0 or CK180. For example, data bus DQ may provide a data rate of 4 gigabits per second (Gbps). Sensing circuit 400 only requires that clock signals CK0 and CK180 each have a clock rate of 2 gigahertz (GHz).

Figure 5A:
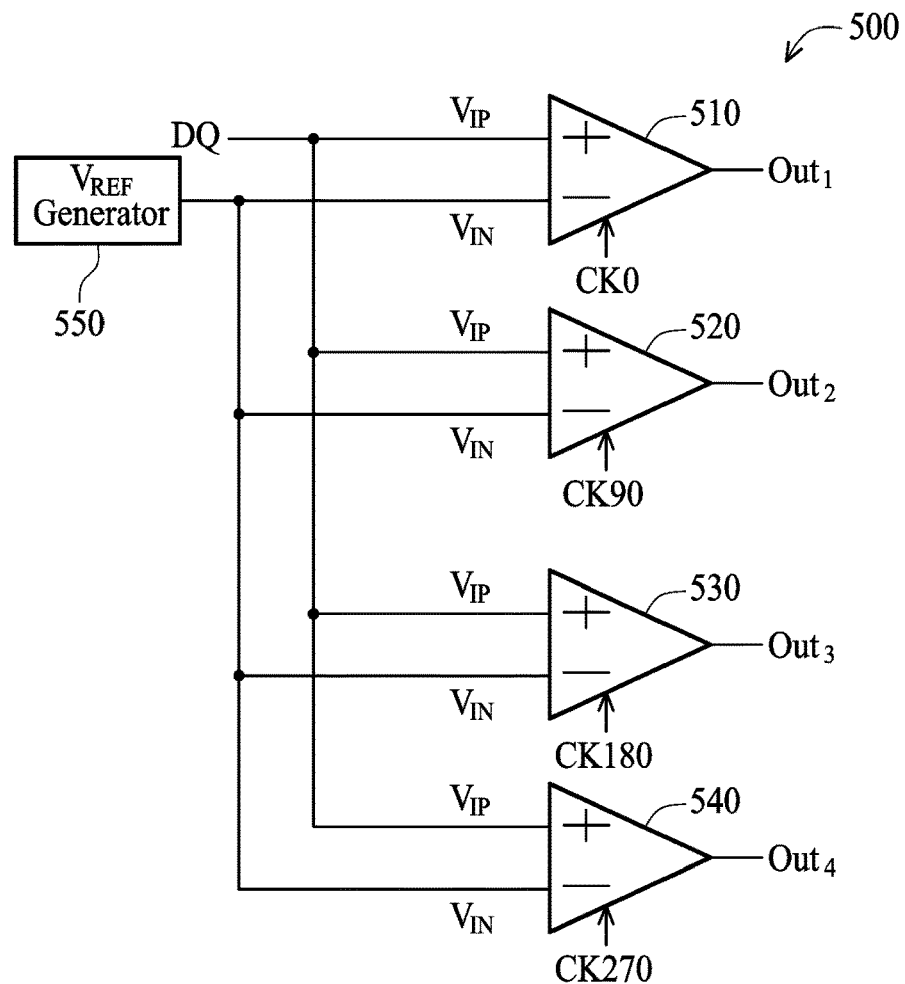
FIG. 5A is a diagram of another exemplary sensing circuit, in accordance with some embodiments.

FIG. 5A is a diagram of another exemplary sensing circuit 500, in accordance with some embodiments. As shown in FIG. 5A, sensing circuit 500 includes sense amplifiers 510, 520, 530, and 540 and a $V_{REF}$ generator 550. Sense amplifiers 510, 520, 530, and 540 are implemented based on sense amplifier 300 (FIG. 3). Input terminals of sense amplifiers 510, 520, 530, and 540 for receiving input signals $V_{IN}$ are coupled to $V_{REF}$ generator 550. Input terminals of sense amplifiers 510, 520, 530, and 540 for receiving input signals $V_{IP}$ are coupled to data bus DQ. Sense amplifiers 510, 520, 530, and 540 respectively receive clock signals CK0, CK90, CK180, and CK270. Clock signals CK90, CK180, and CK270 respectively have a phase shift of 90°, 180°, and 270° from clock signal CK0. Clock signals CK0, CK90, CK180, and CK270 each correspond to clock signal CKB (FIG. 3) in sense amplifier 300. Sense amplifiers 510, 520, 530, and 540 respectively generate output signals $Out_1$, $Out_2$, $Out_3$, and $Out_4$ based on input signals $V_{IP}$ and $V_{IN}$ from data bus DQ and $V_{REF}$ generator 550.

In conventional sensing circuits, four reference signal generators or four unit-gain buffers may be needed to generate or enhance four reference voltage signals for four sense amplifiers. As shown in FIG. 5A, in sensing circuit 500, input signal $V_{IN}$ is generated by the single $V_{REF}$ generator 550 and provided to sense amplifiers 510, 520, 530, and 540 without using any buffers. This is possible because of the reduced kickback noise in sense amplifier 300 (FIG. 3), as explained for sense amplifier 100 (FIG. 1). Sensing circuit 500 does not need additional three $V_{REF}$ generators or four unit-gain buffers and therefore has reduced area, as compared to conventional sensing circuits.

Figure 5B:
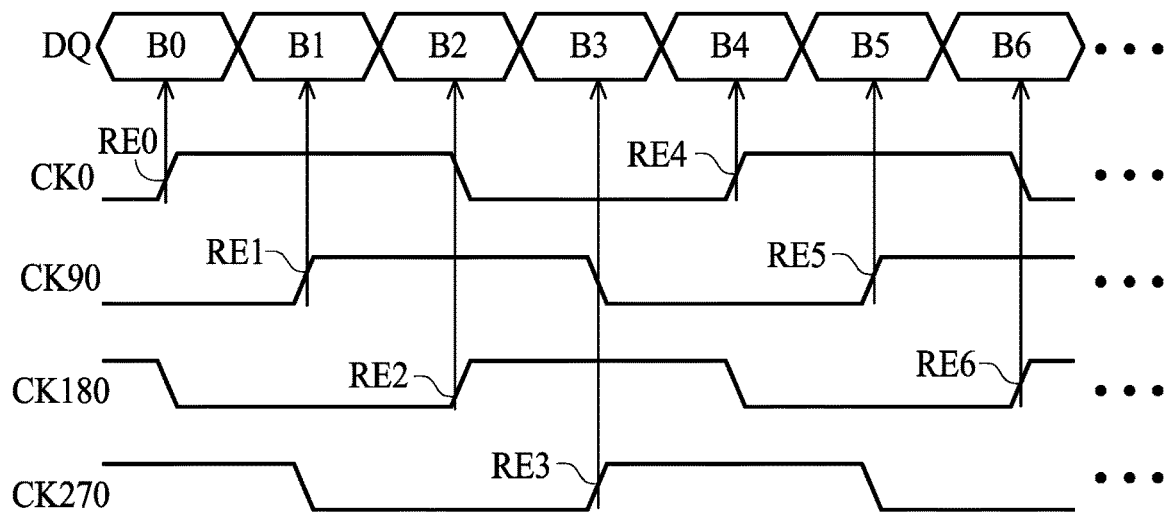
FIG. 5B is an exemplary timing diagram of the sensing circuit in FIG. 5A, in accordance with some embodiments.

FIG. 5B is an exemplary timing diagram of sensing circuit 500 in FIG. in accordance with some embodiments. As shown in FIG. 5B, data bus DQ has bit signals B0 to B6 in series. Clock signal CK0's rising edges RE0 and RE4 occur when bit signals B0 and B4 are stable, respectively. Clock signal CK90's rising edges RE1 and RE5 occur when bit signals B1 and B5 are stable, respectively. Clock signal CK180's rising edges RE2 and RE6 occur when bit signals B2 and B6 are stable, respectively. CK270's rising edge RE3 occurs when bit signal B3 is stable.

Like the operation of sensing circuit 400 described above with reference to FIG. 4B, sense amplifier 510 is configured to sense and amplify bit signals B0 and B4 respectively at rising edges RE0 and RE4 and generate output signal $Out_1$ with operable voltages. Sense amplifier 520 is configured to sense and amplify bit signals B1 and B5 respectively at rising edges RE1 and RE5 and generate output signal $Out_2$ with operable voltages. Sense amplifier 530 is configured to sense and amplify bit signals B2 and B6 respectively at rising edges RE2 and RE6 and generate output signal $Out_3$ with operable voltages. Sense amplifier 540 is configured to sense and amplify bit signal B3 at rising edge RE3 and generate output signal $Out_4$ with an operable voltage.

In sensing circuit 500, sense amplifiers 510, 520, 530, and 540 are configured to, in turn, sense and amplify (i.e., receive or sample) bit signals B0 to B6 from data bus DQ. This allows sensing circuit 500 to operate at a quadruple data rate (QDR), as compared to a clock rate of clock signal CK0, CK90, CK180, or CK270. For example, data bus DQ may provide a data rate of 4 Gbps. Sensing circuit 500 only requires that clock signals CK0, CK90, CK180, and CK270 each have a clock rate of 1 GHz.

Figure 6:
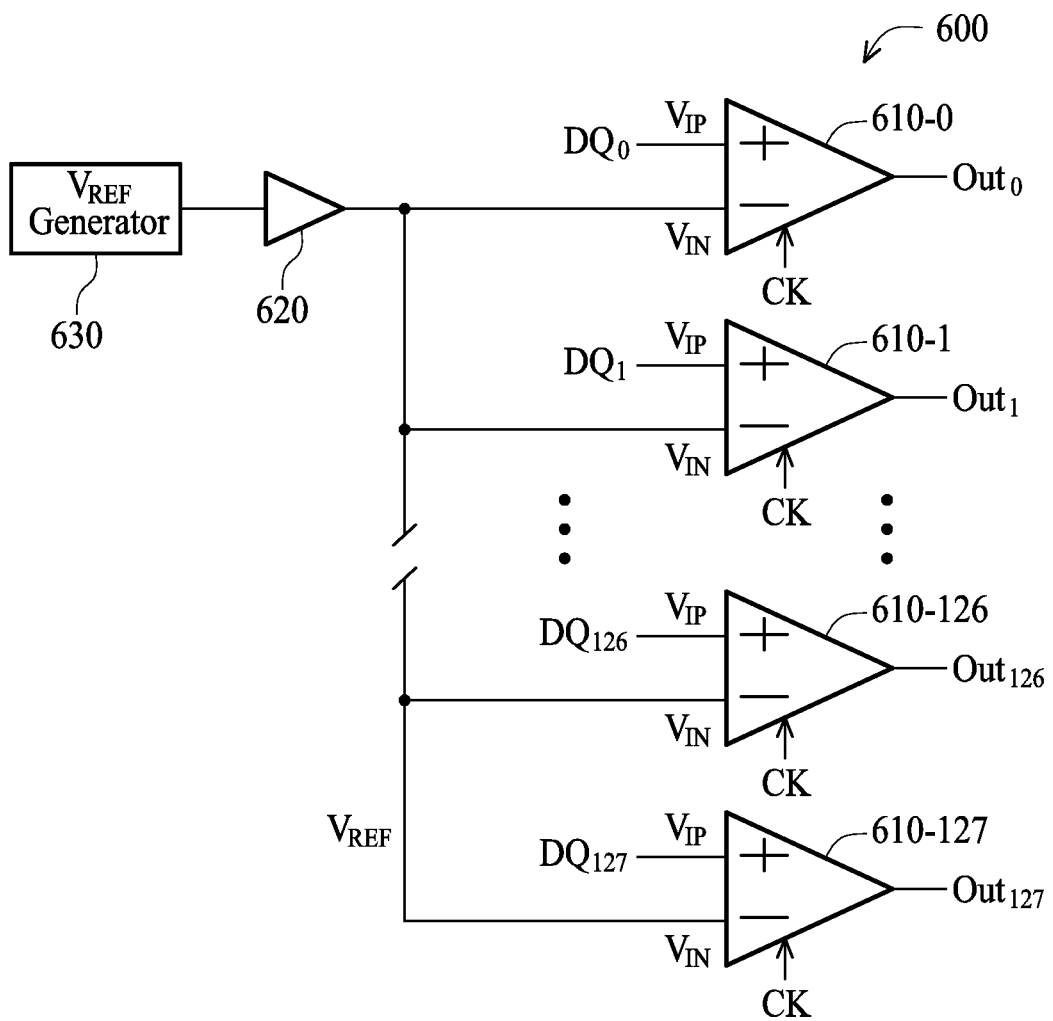
FIG. 6 is a diagram of another exemplary sensing circuit, in accordance with some embodiments.

FIG. 6 is a diagram of another exemplary sensing circuit 600, in accordance with some embodiments. As shown in FIG. 6, sensing circuit 600 includes sense amplifiers 610-0, 610-1, . . . , and 610-127, a buffer 620, and a $V_{REF}$ generator 630. Sense amplifiers 610-0, 610-1, . . . , and 610-127 are implemented based on sense amplifier 100 (FIG. 1) or 300 (FIG. 3). Input terminals of sense amplifiers 610-0, 610-1, . . . , and 610-127 for receiving input signals $V_{IN}$ are coupled to buffer 620 for receiving buffered voltage reference signals $V_{REF}$. Buffer 620 is coupled to $V_{REF}$ generator 630. Input terminals of sense amplifiers 610-0, 610-1, . . . , and 610-127 for receiving input signals $V_{IP}$ are coupled to data buses $DQ_0$, $DQ_1$, . . . , and $DQ_{127}$. Sense amplifiers 610-0, 610-1, . . . , and 610-127 each receive a clock signal CK. Sense amplifiers 610-0, 610-1, . . . , and 610-127 respectively generate output signals $Out_0$, $Out_1$, . . . , and $Out_{127}$ based on input signals $V_{IP}$ and $V_{IN}$ from data buses $DQ_0$ to $DQ_{127}$ and $V_{REF}$ generator 630. Sensing circuit 600 is configured to sense and amplify 128 bit signals from data buses $DQ_0$ to $DQ_{127}$ based on clock signals CK, and generate output signals $Out_1$ to $Out_{127}$ with operable voltages in parallel. Clock signals CK each correspond to clock signal CK of sense amplifier 100 (FIG. 1) or CKB of sense amplifier 300 (FIG. 3).

In conventional sensing circuits, additional reference signal generators or unit-gain amplifiers may be needed to compensate for kickback noises in 128 conventional sense amplifiers. In sensing circuit 600, only buffer 620 is required to enhance reference voltage signal $V_{REF}$ for sense amplifiers 610-0, 610-1, . . . , and 610-127. Sensing circuit 600 therefore has reduced area, as compared to the conventional sensing circuits. In some embodiments, a sensing circuit may include two or more buffers to enhance reference voltage signal $V_{REF}$. For example, sensing circuit 600 may include 32 buffers, each buffer being configured to enhance reference voltage signal $V_{REF}$ for four of sense amplifiers 610-0, 610-1, . . . , and 610-127. The sensing circuit so configured still has reduced area, as compared to conventional sensing circuits.

Figure 7:
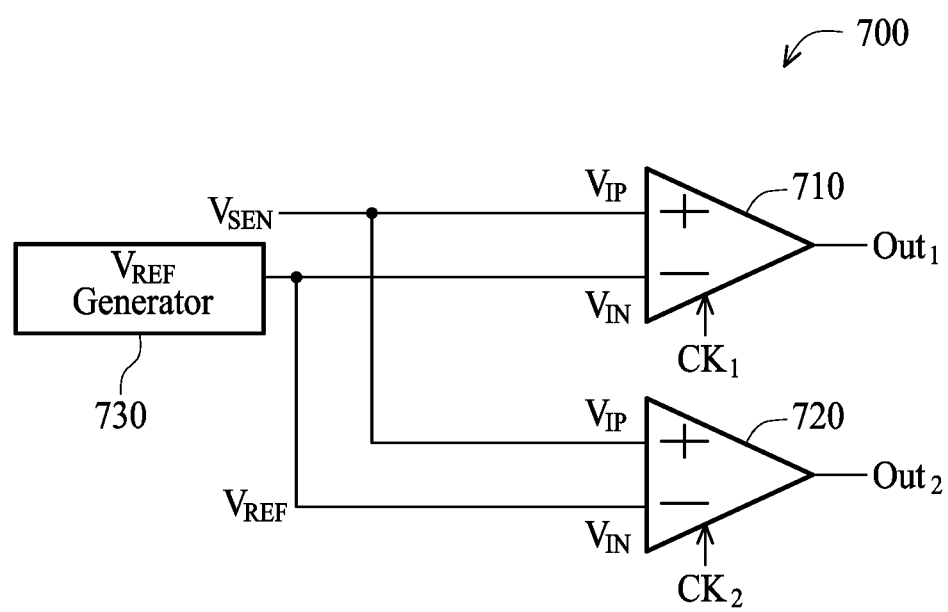
FIG. 7 is a diagram of another exemplary sensing circuit, in accordance with some embodiments.

FIG. 7 is a diagram of another exemplary sensing circuit 700, in accordance with some embodiments. As shown in FIG. 7, sensing circuit 700 includes sense amplifiers 710 and 720 and a $V_{REF}$ generator 730. Sense amplifiers 710 and 720 are implemented based on sense amplifier 100 (FIG. 1) or 300 (FIG. 3). Input terminals of sense amplifiers 710 and 720 for receiving input signals $V_{IN}$ are coupled to $V_{REF}$ generator 730. Input terminals of sense amplifiers 710 and 720 for receiving input signals $V_{IP}$ are coupled to a sensor (not shown) to receive a sensed signal VSEN. Sense amplifiers 710 and 720 respectively receive clock signals CK1 and CK2. Clock signal CK2 has a phase shift from clock signal CK1. Clock signals CK1 and CK2 each correspond to clock signal CK (FIG. 1) or CKB (FIG. 3). Sense amplifiers 710 and 720 respectively generate output signals $Out_1$ and $Out_2$ based on input signals $V_{IP}$ and $V_{IN}$ from the sensor and $V_{REF}$ generator 430.

Sensing circuit 700 can be configured to sense and amplify signals from the sensor based on clock signals CK1 and CK2. A controller (not shown) may be configured to adjust a magnitude of the phase shift between clock signals CK1 and CK2 based on various applications. In some embodiments, sensing circuit 700 may further include more than two sense amplifiers to operate at a higher sensing rate.

Figure 8:
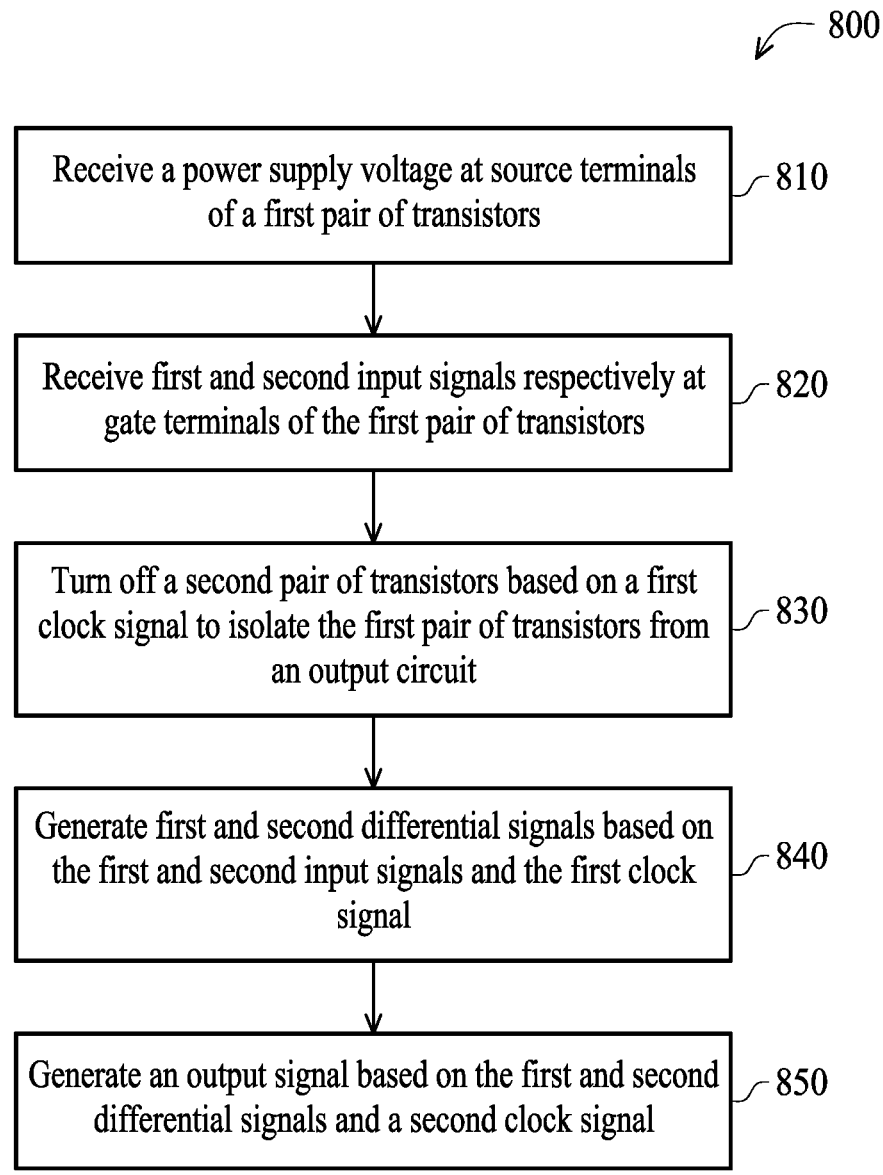
FIG. 8 is a flowchart of an exemplary method for sensing signal voltage, in accordance with some embodiments.

FIG. 8 is a flowchart of an exemplary method 800 for sensing a signal voltage, in accordance with some embodiments. Method 800 may be practiced by circuits disclosed and illustrated in the present disclosure. Method 800 includes receiving a power supply voltage at source terminals of a first pair of transistors (step 810), receiving first and second input signals respectively at gate terminals of the first pair of transistors (step 820), turning off a second pair of transistors based on a first clock signal to isolate the first pair of transistors from an output circuit (step 830), generating first and second differential signals based on the first and second input signals and the first clock signal (step 840), and generating an output signal based on the first and second differential signals and a second clock signal (step 850).

Step 810 includes receiving a power supply voltage at source terminals of a first pair of transistors. For example, as shown and described above with reference to FIG. 1, the source terminals of the first pair of transistors 111 and 112 are coupled to power supply terminal 181 to receive a power supply voltage of the positive power voltage level $V_{DD}$. That is, sense amplifier 100 is configured to receive the power supply voltage of the positive power voltage level $V_{DD}$ at the source terminals of the first pair of transistors 111 and 112.

Step 820 includes receiving first and second input signals respectively at gate terminals of the first pair of transistors. In the example above for step 810, the gate terminals of the first pair of transistors 111 and 112 are coupled to receive input signals $V_{IP}$ and $V_{IN}$, respectively. That is, sense amplifier 100 is configured to receive input signals $V_{IP}$ and $V_{IN}$ respectively at the gate terminals of the first pair of transistors 111 and 112.

Step 830 includes turning off a second pair of transistors based on a first clock signal to isolate the first pair of transistors from an output circuit. For example, in sense amplifier 100 (FIG. 1), when clock signal CK transits to the high voltage level, the second pair of transistors 121 and 122 is switched off. Thus, the first pair of transistors 111 and 112 is isolated from output circuit 100-2. That is, sense amplifier 100 is configured to turn off the second pair of transistors 121 and 122 based on clock signal CK to isolate the first pair of transistors 111 and 112 from output circuit 100-2 and the third pair of transistors 131 and 132, as described above with reference to FIGS. 1 and 2A-2C.

Step 840 includes generating first and second differential signals based on the first and second input signals and the first clock signal. For example, input circuit 100-1 of sense amplifier 100 (FIG. 1) is configured to generate internal output signals Int-Out$_1$ and Int-Out$_2$ on conductive lines 126 and 127 (i.e., two differential signals) based on input signals $V_{IP}$ and $V_{IN}$ and clock signal CK, as described above with reference to FIGS. 1 and 2A-2C. Specifically, input circuit 100-1 is configured to sense a voltage difference between input signals $V_{IP}$ and $V_{IN}$, and to generate internal output signals Int-Out$_1$ and Int-Out$_2$ on conductive lines 126 and 127 (i.e., two differential signals) based on the voltage difference, as described above with reference to FIGS. 1 and 2A-2C.

Step 850 includes generating an output signal based on the first and second differential signals and a second clock signal. For example, output circuit 100-2 of sense amplifier 100 (FIG. 1) is configured to determine output signal Out based on internal output signals Int-Out$_1$ and Int-Out$_2$ (i.e., two differential signals) and clock signal CKB, as described above with reference to FIGS. 1 and 2A-2C. Clock signal CKB has the phase shift of $\pi$ (i.e., 180°) from clock signal CK.

This disclosure relates to a sense amplifier for sensing and amplifying an input signal to be an output signal with an operable voltage. The sense amplifier includes an input circuit and an output circuit. The input circuit includes a first pair of transistors having gate terminals respectively coupled to a first input terminal for receiving a first input signal and to a second input terminal for receiving a second input signal. The source terminals of the first pair of transistors are coupled to a first power supply terminal for receiving a fixed voltage level. This helps reduce or avoid kickback noise from parasitic capacitors between the gate and source terminals of each of the first pair of transistors. In addition, because the kickback noise from the source terminals is reduced or avoided, the total volume of kickback noise in the sense amplifier is also reduced. This is helpful for the accuracy of the sense amplifier. And when two or more sense amplifiers disclosed herein are implemented in a sensing circuit, the two or more sense amplifiers can receive a reference voltage from a common reference voltage generator. This is helpful for reducing area of the sensing circuit. In some embodiments, there may be no need to use unit-gain buffers in the sensing circuit. It is also helpful to reduce area of the sensing circuit.

The input circuit of the sense amplifier also includes a second pair of transistors having gate terminals coupled to a clock terminal and source terminals respectively coupled to drain terminals of the first pair of transistors. The second pair of transistors can be configured to isolate the first pair of transistors from the other circuits of the sense amplifier. This is helpful for an output circuit to evaluate an output signal accurately. The input circuit also includes a third pair of transistors respectively coupled between the second pair of transistors and a second power supply terminal. That is, the input signal includes two stacked circuits of three transistors between the first and second power supply terminals. Stacking three transistors in the input circuit allows the sense amplifier to operate at a higher speed than sense amplifiers stacking four or more transistors.

The output circuit of the sense amplifier is coupled to the drain terminals of the second pair of transistors and has an output terminal. The output circuit also includes stacked circuits of three transistors between two power supply terminals. This helps the sense amplifier to evaluate the output signal at a higher speed than sense amplifiers stacking four or more transistors.

One aspect of this disclosure relates to a sense amplifier. The sense amplifier includes a first pair of transistors having gate terminals respectively coupled to a first input terminal for receiving a first input signal and to a second input terminal for receiving a second input signal, source terminals coupled to a first power supply terminal, and drain terminals. The sense amplifier also includes a second pair of transistors having gate terminals coupled to a clock terminal, source terminals respectively coupled to the drain terminals of the first pair of transistors, and drain terminals. The sense amplifier also includes a third pair of transistors having gate terminals coupled to the clock terminal, drain terminals respectively coupled to the drain terminals of the second pair of transistors, and source terminals coupled to a second power supply terminal. In addition, the sense amplifier includes an output circuit coupled to the drain terminals of the second pair of transistors and having an output terminal.

Another aspect of this disclosure relates to a sense amplifier. The sense amplifier includes a first stacked circuit of first, second, and third transistors coupled between first and second power supply terminals. The first transistor includes a source terminal coupled to the first power supply terminal and a gate terminal coupled to a first input terminal for receiving a first input signal. The second transistor is coupled between the first transistor and the third transistor. The third transistor is coupled between the second transistor and the second power supply terminal. The sense amplifier also includes a second stacked circuit of fourth, fifth, and sixth transistors coupled between the first and second power supply terminals. The fourth transistor includes a source terminal coupled to the first power terminal and a gate terminal coupled to a second input terminal for receiving a second input signal. The fifth transistor is coupled between the fourth transistor and the sixth transistor. The sixth transistor is coupled between the fifth transistor and the second power supply terminal. The sense amplifier also includes an output circuit. The output circuit is coupled to the first and second stacked circuits and has an output terminal. The output circuit includes third, fourth, fifth, and sixth stacked circuits each having three transistors. The third and fourth stacked circuits share a seventh stacked circuit of two transistors. The fifth and sixth stacked circuits share an eighth stacked circuit of two transistors.

Still another aspect of this disclosure relates to a method for sensing a signal voltage. The method includes receiving a power supply voltage at source terminals of a first pair of transistors, receiving first and second input signals respectively at gate terminals of the first pair of transistors, and turning off a second pair of transistors based on a first clock signal to isolate the first pair of transistors from an output circuit. In addition, the method includes generating first and second differential signals based on the first and second input signals and the first clock signal, and generating an output signal based the first and second differential signals and a second clock signal. The second clock signal has a phase shift from the first clock signal.

Specific examples of circuits, capacitors, transistors have been provided. However, these examples are not intended to be limiting. Persons of ordinary skill will now understand that the embodiments herein can be practiced with equal effectiveness with components having other circuits, capacitors, and/or transistors.

The foregoing outlines features of several embodiments so that those skilled in the art may better understand the aspects of the present disclosure. Those skilled in the art should appreciate that they may readily use the present disclosure as a basis for designing or modifying other circuits and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier, comprising:
   a first pair of transistors having gate terminals respectively coupled to a first input terminal for receiving a first input signal and to a second input terminal for receiving a second input signal, source terminals coupled to a first power supply terminal, and drain terminals;
   a second pair of transistors having gate terminals coupled to a clock terminal, source terminals respectively coupled to the drain terminals of the first pair of transistors, and drain terminals;
   a third pair of transistors having gate terminals coupled to the clock terminal, drain terminals respectively coupled to the drain terminals of the second pair of transistors, and source terminals coupled to a second power supply terminal; and
   an output circuit coupled to the drain terminals of the second pair of transistors and having an output terminal.

2. The sense amplifier of claim 1, wherein:
   a first one of the first pair of transistors, a first one of the second pair of transistors, and a first one of the third pair of transistors are coupled as a first stacked circuit of three transistors between the first and second power supply terminals; and
   a second one of the first pair of transistors, a second one of the second pair of transistors, and a second one of the third pair of transistors are coupled as a second stacked circuit of three transistors between the first and second power supply terminals.

3. The sense amplifier of claim 1, wherein the first power supply terminal is configured to provide power of a fixed voltage level.

4. The sense amplifier of claim 1, wherein:
   the first pair of transistors and the second pair of transistors are p-channel transistors;
   the third pair of transistors are n-channel transistors;
   the first power supply terminal is configured to provide first power of a positive voltage level; and
   the second power supply terminal is configured to provide second power of a reference voltage level.

5. The sense amplifier of claim 1, wherein:
   the first pair of transistors and the second pair of transistors are n-channel transistors;
   the third pair of transistors are p-channel transistors;
   the first power supply terminal is configured to provide first power of a reference voltage level; and
   the second power supply terminal is configured to provide second power of a positive voltage level.

6. The sense amplifier of claim 1, wherein the output terminal is a first output terminal, and the clock terminal is a first clock terminal, the output circuit further comprising:
   a second output terminal;
   a fourth pair of transistors having source terminals coupled to a third power supply terminal, drain terminals coupled to the first output terminal, and gate terminals respectively coupled to a second clock terminal and the second output terminal; and
   a fifth pair of transistors having source terminals coupled to the third power supply terminal, drain terminals coupled to the second output terminal, and gate terminals respectively coupled to the second clock terminal and the first output terminal.

7. The sense amplifier of claim 6, the output circuit further comprises:
   a first stacked circuit of two transistors coupled between the drain terminals of the fourth pair of transistors and a fourth power supply terminal, and having gate terminals respectively coupled to the drain terminal of a first one of the second pair of transistors and to the second output terminal; and
   a second stacked circuit of two transistors coupled between the drain terminals of the fifth pair of transistors and the fourth power supply terminal, and having gate terminals respectively coupled to the drain terminal of a second one of the second pair of transistors and to the first output terminal.

8. The sense amplifier of claim 7, wherein:
   a first one of the fourth pair of transistors and the first stacked circuit of two transistors are coupled as a third stacked circuit of three transistors between the third and fourth power supply terminals;
   a second one of the fourth pair of transistors and the first stacked circuit of two transistors are coupled as a fourth stacked circuit of three transistors between the third and fourth power supply terminals;
   a first of the fifth pair of transistors and the second stacked circuit of two transistors are coupled as a fifth stacked circuit of three transistors between the third and fourth power supply terminals; and
   a second of the fifth pair of transistors and the second stacked circuit of two transistors are coupled as a sixth stacked circuit of three transistors between the third and fourth power supply terminals.

9. The sense amplifier of claim 8, wherein:
the first, second, fourth, and fifth pairs of transistors are p-channel transistors; and
the third pair of transistors, the first stacked circuit of two transistors, and the second stacked circuit of two transistors are n-channel transistors.

10. The sense amplifier of claim 8, wherein:
the first, second, fourth, and fifth pairs of transistors are n-channel transistors; and
the third pair of transistors, the first stacked circuit of two transistors, and the second stacked circuit of two transistors are p-channel transistors.

11. The sense amplifier of claim 6, wherein:
the first clock terminal is configured to receive a first clock signal;
the second clock terminal is configured to receive a second clock signal; and
the second clock signal has a phase shift from the first clock signal.

12. The sense amplifier of claim 6, wherein:
the first and third power supply terminals are configured to receive first power of a positive voltage level; and
the second and fourth power supply terminals are configured to receive second power of a reference voltage level.

13. The sense amplifier of claim 6, wherein:
the first and third power supply terminals are configured to receive first power of a reference voltage level; and
the second and fourth power supply terminals are configured to receive second power of a positive voltage level.

14. The sense amplifier of claim 6, wherein:
the first output terminal is configured to output a first output signal;
the second output terminal is configured to output a second output signal; and
the second output signal is an inverted signal of the first output signal.

15. A sense amplifier, comprising:
a first stacked circuit of first, second, and third transistors coupled between first and second power supply terminals, wherein:
the first transistor includes a source terminal coupled to the first power supply terminal and a gate terminal coupled to a first input terminal for receiving a first input signal;
the second transistor is coupled between the first transistor and the third transistor; and
the third transistor is coupled between the second transistor and the second power supply terminal;
a second stacked circuit of fourth, fifth, and sixth transistors coupled between the first and second power supply terminals, wherein:
the fourth transistor includes a source terminal coupled to the first power terminal and a gate terminal coupled to a second input terminal for receiving a second input signal;
the fifth transistor is coupled between the fourth transistor and the sixth transistor; and
the sixth transistor is coupled between the fifth transistor and the second power supply terminal; and
an output circuit, coupled to the first and second stacked circuits, having an output terminal, and comprising third, fourth, fifth, and sixth stacked circuits each having three transistors, the third and fourth stacked circuits sharing a seventh stacked circuit of two transistors, the fifth and sixth stacked circuits sharing an eighth stacked circuit of two transistors.

16. The sense amplifier of claim 15, wherein the output circuit is coupled to drain terminals of the second and fifth transistors.

17. The sense amplifier of claim 15, wherein:
gate terminals of the second, third, fifth, and sixth transistors are coupled to a clock terminal;
the first, second, fourth, and fifth transistors are first-type transistors; and
the third and sixth transistors are second-type transistors, the second-type transistors being a different type than the first-type transistors.

18. A method for sensing a signal voltage, comprising:
receiving a power supply voltage at source terminals of a first pair of transistors;
receiving first and second input signals respectively at gate terminals of the first pair of transistors;
turning off a second pair of transistors based on a first clock signal to isolate the first pair of transistors from an output circuit;
generating first and second differential signals based on the first and second input signals and the first clock signal;
generating an output signal based on the first and second differential signals and a second clock signal, the second clock signal having a phase shift from the first clock signal.

19. The method of claim 18, wherein turning off the second pair of transistors comprises:
switching off the second pair of transistors to isolate the first pair of transistors from the output circuit and a third pair of transistors.

20. The method of claim 18, wherein generating the first and second differential signals based on the first and second input signals and the first clock signal comprises:
sensing a voltage difference between the first and second input signals; and
generating the first and second differential signals based on the voltage difference.

* * * * *